US011937406B2

(12) United States Patent
Chehade et al.

(10) Patent No.: US 11,937,406 B2
(45) Date of Patent: Mar. 19, 2024

(54) COOLING SYSTEM PROVIDING COOLING TO AN INFRASTRUCTURE HAVING A PLURALITY OF HEAT-GENERATING UNITS

(71) Applicant: OVH, Roubaix (FR)

(72) Inventors: Ali Chehade, Moncheaux (FR); Hadrien Bauduin, Villeneuve d'Ascq (FR)

(73) Assignee: OVH, Roubaix (FR)

( * ) Notice: Subject to any disclaimer, the term of this patent is extended or adjusted under 35 U.S.C. 154(b) by 42 days.

(21) Appl. No.: 17/837,295

(22) Filed: Jun. 10, 2022

(65) Prior Publication Data

US 2022/0304194 A1    Sep. 22, 2022

Related U.S. Application Data

(63) Continuation of application No. 17/105,405, filed on Nov. 25, 2020, now Pat. No. 11,406,047.

(30) Foreign Application Priority Data

Nov. 29, 2019  (EP) ..................................... 19315151

(51) Int. Cl.
*H05K 7/20* (2006.01)
*H01L 23/427* (2006.01)

(52) U.S. Cl.
CPC ..... *H05K 7/20772* (2013.01); *H01L 23/4275* (2013.01); *H05K 7/20327* (2013.01);
(Continued)

(58) Field of Classification Search
CPC ........... H05K 7/20254; H05K 7/20272; H05K 7/20327; H05K 7/20763–20772;
(Continued)

(56) References Cited

U.S. PATENT DOCUMENTS

| 5,765,389 A | 6/1998 | Salyer |
| 6,397,618 B1 | 6/2002 | Chu et al. |

(Continued)

FOREIGN PATENT DOCUMENTS

| EP | 1909549 A2 | 4/2008 |
| EP | 2881690 A1 | 6/2015 |

OTHER PUBLICATIONS

Extended European Search Report with regard to the counterpart EP Patent Application No. 19315151.1 completed May 20, 2020.
(Continued)

*Primary Examiner* — Zachary Pape
(74) *Attorney, Agent, or Firm* — BCF LLP

(57) ABSTRACT

A system provides cooling to an infrastructure having heat-generating units. Internal cooling units are thermally connected to the heat-generating units. An external cooling unit dissipates thermal energy of a heat-transfer fluid circulating in the internal cooling units. A cooling circuit connects the internal and external cooling units. A pump maintains a flow of the heat-transfer fluid for transferring thermal energy from the heat generating units to the external cooling unit. A reservoir thermally connected to the cooling circuit contains a phase change material (PCM) changing between solid and liquid states according to a temperature of the heat-transfer fluid. Thermal energy is transferred between the cooling circuit and the PCM depending on whether a temperature of the heat-transfer fluid is above or below a phase-change temperature value of the PCM. A supplemental cooling device thermally connected to the reservoir dissipates heat from the reservoir to the atmosphere.

9 Claims, 7 Drawing Sheets

(52) U.S. Cl.
CPC ......... *H05K 7/208* (2013.01); *H05K 7/20254* (2013.01); *H05K 7/20809* (2013.01)

(58) Field of Classification Search
CPC ...... H05K 7/208–20809; F28D 20/021; F28D 2020/0013
See application file for complete search history.

(56) References Cited

U.S. PATENT DOCUMENTS

| | | | |
|---|---|---|---|
| 8,783,052 | B2 | 7/2014 | Campbell et al. |
| 9,681,589 | B1* | 6/2017 | Ross ................... H05K 7/2079 |
| 9,723,762 | B1 | 8/2017 | Ross et al. |
| 10,182,513 | B2 | 1/2019 | Quinn et al. |
| 10,966,352 | B2 | 3/2021 | Iyengar et al. |
| 2006/0042289 | A1 | 3/2006 | Campbell et al. |
| 2006/0126293 | A1* | 6/2006 | Campbell ............ H05K 7/2079 |
| | | | 361/699 |
| 2007/0227710 | A1 | 10/2007 | Belady et al. |
| 2008/0141703 | A1 | 6/2008 | Bean, Jr. |
| 2009/0180250 | A1 | 7/2009 | Holling et al. |
| 2011/0103008 | A1* | 5/2011 | Aklilu ...................... G06F 1/20 |
| | | | 361/679.48 |
| 2012/0111036 | A1 | 5/2012 | Campbell et al. |
| 2012/0125573 | A1* | 5/2012 | Rubenstein ............. F28D 20/02 |
| | | | 165/104.33 |
| 2013/0008638 | A1 | 1/2013 | Quinn et al. |
| 2016/0016246 | A1 | 1/2016 | Bugby et al. |
| 2016/0338230 | A1 | 11/2016 | Kaplan et al. |
| 2019/0115640 | A1 | 4/2019 | Kollár et al. |

OTHER PUBLICATIONS

Partial European Search Report with regard to the counterpart EP Patent Application No. 19315151.1 completed May 20, 2020.
EPO Communication with regard to the counterpart EP Patent Application No. 19315151.1 dated Apr. 15, 2021.
Extended European Search Report with regard to the counterpart EP Patent Application No. 20208404.2 completed Apr. 8, 2021.
English Abstract for EP2881690 retrieved on Espacenet on Sep. 30, 2021.

* cited by examiner

COOLING SYSTEM PROVIDING COOLING TO AN INFRASTRUCTURE HAVING A PLURALITY OF HEAT-GENERATING UNITS

CROSS-REFERENCE

The present application is a continuation of U.S. patent application Ser. No. 17/105,405, filed on Nov. 25, 2020 claiming priority from European Patent Application No. 19315151.1, filed on Nov. 29, 2019, the disclosure of both which is incorporated by reference herein.

FIELD

The present technology relates to cooling techniques for electronic equipment. In particular, a cooling system providing cooling to an infrastructure having a plurality of heat-generating units is disclosed.

BACKGROUND

Electronic equipment, for example servers, memory banks, computer discs, and the like, is conventionally grouped in equipment racks. Large data centers and other large computing infrastructures may contain thousands of racks supporting thousands or even tens of thousands of servers.

The equipment mounted in the racks consumes large amounts of electric power and generate significant amounts of heat. Cooling needs are important in such racks. Some electronic devices, such as processors, generate so much heat that they could fail within seconds in case of a lack of cooling.

Forced air-cooling has been traditionally used to disperse heat generated by processors and other heat-generating components of servers mounted in server racks. Air-cooling requires the use of powerful fans, the provision of space between servers or between components of a server for placing heat sinks and for allowing sufficient airflow, and is generally not very efficient.

Water-cooling technologies, for example using water-cooling, is increasingly used to as an efficient and cost-effective solution to preserve safe operating temperatures of servers and like equipment mounted in racks. Rack mounted water-cooling units, for example so-called water blocks, are mounted on heat-generating components, such as processors. Heat is absorbed by water flowing between these water-cooling units and heat exchange components located outside of the racks. The heated water flows from these water-cooling units to external, larger cooling units, for example dry coolers.

Dry coolers and other mechanical cooling techniques are generally quite efficient, except when harsh conditions are encountered, for example during daytime when very high temperatures may be reached in many climates. On a hot day, dry coolers may fail to provide water-cooling units with water at sufficiently low temperatures, no matter the size and number of these dry coolers. If the ambient temperature is too high, no transfer of thermal energy between the dry coolers and the atmosphere is possible.

Delivery of water to water-cooling units relies on pumps connecting the rack mounted water-cooling units to the dry coolers. Pumps may fail and water delivery may be interrupted. Water delivery may diminish due to the presence of impurities in water conduits, also resulting in inadequate cooling capacity.

Temporary failure or insufficiency of water-cooling solutions may lead to loss of service and permanent damages in data centers and other large computing infrastructures.

Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) an important electrical power consumption of conventional cooling systems; (2) inefficiency of conventional external cooling systems in high temperature conditions; and/or (3) impacts of temporary cooling system failures.

In one aspect, various implementations of the present technology provide a cooling system for cooling electronic equipment, the cooling system providing cooling to an infrastructure having a plurality of heat-generating units, the cooling system comprising:
  a plurality of internal cooling units, at least one internal cooling unit of the plurality of internal cooling units being thermally connected to each of the plurality of heat-generating units;
  an external cooling unit configured to dissipate thermal energy of a heat-transfer fluid circulating in the plurality of internal cooling units;
  a cooling circuit connecting the plurality of internal cooling units and the external cooling unit;
  a pump configured to maintain a flow of the heat-transfer fluid circulating in the cooling circuit, allowing to transfer thermal energy from the plurality of heat generating units to the heat-transfer fluid and allowing to transfer thermal energy from the heat-transfer fluid to the external cooling unit;
  a first reservoir thermally connected to a section of the cooling circuit, the first reservoir containing a first phase change material (PCM), the first PCM changing from a solid state to a liquid state when a temperature of the heat-transfer fluid flowing in the section of the cooling circuit causes a temperature of the first PCM to increase above a phase-change temperature value, thereby causing thermal energy to transfer from the cooling circuit to the first PCM, the first PCM changing from the liquid state to the solid state when the temperature of the heat-transfer fluid flowing in the section of the cooling circuit causes the temperature of the first PCM to decrease below the phase-change temperature value, thereby causing thermal energy to dissipate from the first PCM; and
  a supplemental cooling device thermally connected to the first reservoir containing the first PCM and configured to dissipate heat from the first reservoir containing the first PCM to the atmosphere.

In some implementations of the present technology, the cooling system further comprises a controller configured to initiate operation of the supplemental cooling device when an ambient temperature at the infrastructure meets or exceeds a predetermined temperature threshold.

In some implementations of the present technology, the supplemental cooling device comprises: an evaporative cooling system including a sprayer and a fan configured for directing water droplets toward the supplemental cooling device; wherein the controller is configured to initiate operation of the evaporative cooling system when the ambient temperature at the infrastructure meets or exceeds the predetermined temperature threshold.

In some implementations of the present technology, the supplemental cooling device comprises an element selected from: one or more fans; a geothermal cooling system; a fatal energy recovery system; an array of heat pipes extending from the first reservoir containing the first PCM; an array of loop heat pipes extending from the first reservoir containing the first PCM; an array of capillary pumped loops extending from the first reservoir containing the first PCM; an array of thermosiphons extending from the first reservoir containing the first PCM; a dry cooler; and a combination thereof.

In some implementations of the present technology, the section of the cooling circuit thermally connected to the first reservoir containing the first PCM is positioned downstream of a cold outlet of the external cooling unit and upstream of cold inlets of the plurality of internal cooling units within the cooling circuit.

In some implementations of the present technology, the cooling system further comprises a fluid storage tank connected within the cooling circuit, upstream of the cold inlets of the plurality of internal cooling units.

In some implementations of the present technology, the cooling system further comprises a cooling arrangement configured for autonomous cooling of a rack hosting at least one heat-generating component in case of abnormal operating conditions of the cooling system, the cooling arrangement comprising: a closed loop cooling circuit comprising: at least one fluid cooling unit thermally coupled to the at least one heat-generating component, the at least one fluid cooling unit comprising a fluid channel configured for transferring heat from the at least one heat-generating component to a first fluid flowing in the fluid channel, a primary side of a fluid-to-fluid heat exchanger, the primary side being fluidly connected to the fluid channel of the at least one fluid cooling unit, and an inner pump fluidly connected between the primary side of the fluid-to-fluid heat exchanger and the at least one fluid cooling unit, the inner pump being configured for causing the first fluid to flow within the closed loop cooling circuit; and an open loop cooling circuit comprising: a secondary side of the fluid-to-fluid heat exchanger, the secondary side being thermally coupled to the primary side for transfer of heat from the primary side to the secondary side when a temperature of the primary side is higher than a temperature of the secondary side, the secondary side being configured to receive a second fluid from a cold supply line and to return the second fluid to a hot return line, and one or two valves connected to the cold supply line or to the hot supply line and configured to closed under abnormal operating conditions; a second reservoir containing a second PCM, the second reservoir being thermally connected to a section of the closed loop cooling circuit, the second PCM changing from the liquid state to the solid state to transfer thermal energy from the second PCM to the closed loop cooling circuit when a temperature of the first fluid flowing in the section of the closed loop cooling circuit is less than a phase change temperature value of the second PCM, the second PCM changing from the solid state to the liquid state to transfer thermal energy from the closed loop cooling circuit to the second PCM when the temperature of the first fluid flowing in the section of the closed loop cooling circuit reaches or exceeds the phase change temperature; wherein, in normal operating conditions of the cooling system the cooling arrangement and the at least one heat-generating component are combined to form the internal cooling unit and the heat-generating unit, heat generated inside the infrastructure by the at least one heat-generating component being evacuated by the cooling arrangement via the hot return line to the cooling circuit, in order to be externally dissipated to the atmosphere by the cooling arrangement, the fluid flowing in the cooling circuit having been cooled by the cooling arrangement being then supplied to the cooling arrangement via the cold supply line.

In some implementations of the present technology, the at least one fluid cooling unit further comprises: a first casing configured for direct mounting on the at least one heat-generating component; and a second casing mounted on the first casing; one of the first and second casings including the fluid channel; and another one of the first and second casings including a storage containing a third PCM changing from the solid state to the liquid state to transfer thermal energy from the at least one heat-generating unit to the third PCM, the third PCM changing from the liquid state to the solid state to transfer thermal energy from the third PCM to the first fluid flowing in the fluid channel.

In some implementations of the present technology, the cooling system further comprises: a first direct valve positioned upstream or downstream of the first reservoir containing the first PCM in the cooling circuit, the first direct valve being opened to place the first reservoir containing the first PCM within the cooling circuit, the first direct valve being closed to isolate the first reservoir containing the first PCM from the cooling circuit; a first bypass valve positioned in parallel to the first reservoir containing the first PCM in the cooling circuit; and a controller configured to: cause the first direct valve to open and cause the first bypass valve to close to allow a transfer of heat between the first PCM and the heat-transfer fluid when an ambient temperature at the infrastructure meets or exceeds a predetermined temperature threshold, and cause the first direct valve to close and cause the first bypass valve to open to prevent a transfer of heat between the first PCM and the heat-transfer fluid and to ensure a continuity of the cooling circuit when the ambient temperature at the infrastructure is less than the predetermined temperature threshold.

In some implementations of the present technology, the cooling system further comprises: a second direct valve positioned upstream or downstream of the external cooling unit in the cooling circuit, the second direct valve being opened to place the external cooling unit within the cooling circuit, the second direct valve being closed to isolate the external cooling unit from the cooling circuit; and a second bypass valve positioned in parallel to the external cooling unit in the cooling circuit; the controller being further configured to: cause the second direct valve to open and cause the second bypass valve to close to allow the external cooling unit to cool down the heat-transfer fluid, and cause the second direct valve to close and cause the second bypass valve to open to ensure a continuity of the cooling circuit.

In some implementations of the present technology, the controller is further configured to: cause the second direct valve to open and cause the second bypass valve to close when an ambient temperature at the infrastructure is less than a predetermined temperature threshold, and cause the second direct valve to close and cause the second bypass valve to open when the ambient temperature at the infrastructure meets or exceeds the predetermined temperature threshold.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

Figure 1:
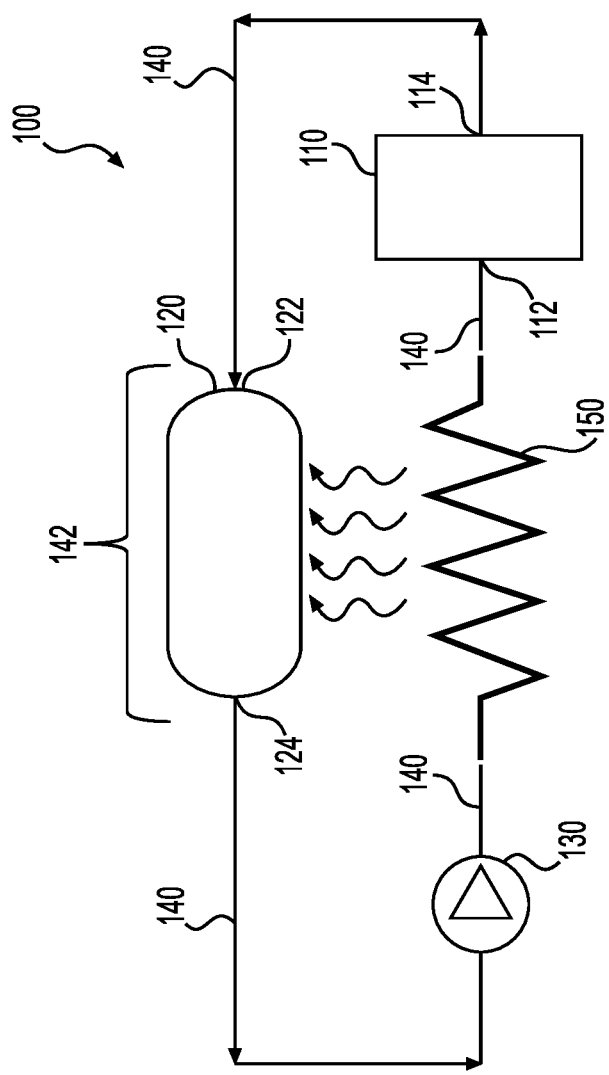
FIG. 1 is a schematic block diagram of a generic cooling arrangement in accordance with an embodiment of the present technology.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in non-transitory computer-readable media and so executed by a computer or processor, whether or not such computer or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

In one aspect, the present technology adds a reservoir containing a phase change material (PCM) to a cooling circuit that contains a plurality of internal cooling units and an external cooling unit, for example and without limitation a dry cooler. An infrastructure, for example and without limitation a datacenter, comprises a plurality of heat-generating units, for example servers, computers, processors, graphical processing units, and the like. The internal cooling units absorb heat from the heat-generating units. A pump circulates a heat-transfer fluid, for example and without limitation water, in the cooling circuit so that heat absorbed by the internal cooling units is transported to the external cooling unit, where its temperature is reduced before returning to the internal cooling units. The reservoir containing the PCM is located in the cooling circuit downstream of the external cooling unit and upstream of the internal cooling units. When the external cooling unit has sufficient capacity to reduce a temperature of the heat-transfer fluid to a desired value, the PCM is in, or changes to, a solid state and is thus charged. When the external cooling unit is exposed to very high temperatures, for example during daytime in the summer, the heat-transfer fluid at its outlet at a higher than the desired value. The PCM changes from the solid state to a liquid state, becoming discharged. This change of phase is an entirely passive endothermic reaction that requires no energy for the PCM to absorb heat from the heat-transfer fluid. As a result, the heat-transfer fluid is returned at a low temperature to the cooling units without consuming any electrical or other energy resource.

In another aspect, the present technology, a cooling arrangement for autonomous cooling of a rack hosting a heat-generating component. The cooling arrangement comprises a closed loop cooling circuit and an open loop cooling circuit. In the closed loop cooling circuit, a pump causes a first fluid, for example and without limitation water, to flow between a fluid cooling unit thermally coupled to the heat-generating component and a primary side of a fluid-to-fluid heat exchanger. The open loop includes secondary side of the fluid-to-fluid heat exchanger, the secondary side being connected to a cold supply line and a hot return line. A second fluid, for example and without limitation water, flowing in the secondary side absorbs heat from the primary side. A reservoir containing a PCM is thermally connected to a section of the closed loop cooling circuit. The PCM changes from a liquid state to a solid state, and becomes charged, to transfer thermal energy from the PCM to the closed loop cooling circuit when a temperature of the first fluid flowing in the section of the closed loop cooling circuit is less than a phase change temperature value of the PCM. The PCM changes from the solid state to the liquid state, and becomes discharged, to transfer thermal energy from the closed loop cooling circuit to the PCM when the temperature of the first fluid flowing in the section of the closed loop cooling circuit reaches or exceeds the phase change temperature.

In a further aspect, the present technology, a cooling device is mountable on a heat-generating component. The cooling device includes a first casing and a second casing. The first casing is directly mountable on the heat-generating component. The second casing is mounted on the first casing. One of the casings is a fluid cooling device including an internal channel connected to a cold inlet and to a hot outlet allowing a heat-transfer fluid, for example and without limitation water, to flow in the internal channel. The other casing includes a storage containing a PCM changing from a solid state to a liquid state to transfer thermal energy from the heat-generating unit to the PCM, the PCM changing from the liquid state to the solid state to transfer thermal energy from the PCM to the heat-transfer fluid.

With these fundamentals in place, we will now consider some non-limiting examples to illustrate various implementations of aspects of the present technology.

FIG. 1 is a schematic block diagram of a generic cooling arrangement in accordance with an embodiment of the present technology. A cooling system 100 includes a fluid cooling unit 110, a storage 120 containing a phase change material (PCM) and may comprise a pump 130 for circulating a heat-transfer fluid, for example and without limitation water, in a network of conduits 140. Examples of the fluid cooling unit 110, of the storage 120 and of the pump 130 are presented hereinbelow. The cooling system 100 is thermally connected to heat-generating equipment 150, for example and without limitation a processor, a rack-mounted component, a complete rack, or a complete infrastructure containing a plurality of racks, each rack hosting a plurality of rack-mounted components that each include one or more processors. Heat is transferred from the heat-generating equipment 150 to the heat-transfer fluid contained in the network of conduits 140, or to the PCM contained in the storage 120, or at once to both heat-transfer fluid and the PCM. When the pump 130 is activated, the heat-transfer fluid is received at an inlet 112 of the fluid cooling unit 110. When the fluid cooling unit 110 is in operation, the heat from the heat-transfer fluid is dissipated in the fluid cooling unit 110 is expelled at a reduced temperature at an outlet 114 of the fluid cooling unit 110.

The PCM changes from a solid state to a liquid state, endothermic reaction, when its temperature increases above a phase-change temperature value, whether this temperature increase is caused by heat directly received from the heat-generating component 150 or by a high temperature of the heat-transfer fluid. The PCM changes from the liquid state to the solid state, an exothermic reaction, when its temperature of the PCM decreases below the phase-change temperature value. When in the solid state, the PCM may be understood as being "charged" in the sense that it holds a capacity of absorbing and dissipating heat from the heat-generating component 150. When in the liquid state, the PCM may be understood as being "discharged".

The storage 120 is thermally connected to the fluid cooling unit 110. As illustrated, the storage 120 is in thermal contact with at least a section 142 of the network of conduits 140, downstream of the outlet 114 of the fluid cooling unit 110. A direct physical contact between the fluid cooling unit 110 and the storage 120, whereby heat may be directly transferred from the fluid cooling unit 110 to the storage 120, is also contemplated.

In one embodiment, the storage 120 is positioned downstream of the fluid cooling unit 110 in the network of conduits 140, as shown on FIG. 1. In this embodiment, the fluid cooling unit 110 and the pump 130 are normally activated in view of maintaining a desired low temperature of the heat-transfer fluid at the outlet 114 of the fluid cooling unit 110. If, at that time, the PCM is in the liquid state, it may gradually change to the solid state, increasing somewhat the temperature of the heat-transfer fluid at its outlet 124, until the PCM is fully charged and in the solid state. If the fluid cooling unit 110 is inoperative, or if the fluid cooling unit 110 does not have a sufficient cooling capacity for the heat-transfer fluid at its outlet 114 to reach a desired low temperature, the heat-transfer fluid may reach a temperature that exceeds the phase change temperature value of the PCM when reaching an inlet 122 of the storage 120. In that condition, the PCM contained in the storage 120 may absorb some of the heat from the heat-transfer fluid, gradually changing from the solid state to the liquid state, so that its temperature is lower at its outlet 124 than at its inlet 122.

In another embodiment, the storage 120 may be positioned upstream or downstream of the fluid cooling unit 110 in the network of conduits 140. In this embodiment, the fluid cooling unit 110 is normally inactivated and the PCM contained in the storage 120 absorbs the heat from the heat-transfer fluid present in the network of conduits 140. The fluid cooling unit 110 may be activated when the temperature of the heat-transfer fluid at the outlet 124 of the storage 120 fails to reach a desired low temperature, particularly but without limitation when the PCM is fully discharged.

In yet another embodiment, the storage 120 and the fluid cooling unit 110 may be positioned in parallel, both of the storage 120 and the fluid cooling unit 110 being independently thermally connected to the heat-generating component 150. In this embodiment, the network of conduits 140 may or may not reach the storage 120. The fluid cooling unit 110 may be normally activated or normally deactivated, depending on whether a user of the cooling system 100 prefers the fluid cooling unit 110 or the storage 120 to be used as a principal heat-dissipating component for the heat-generating equipment 150.

Figure 2:
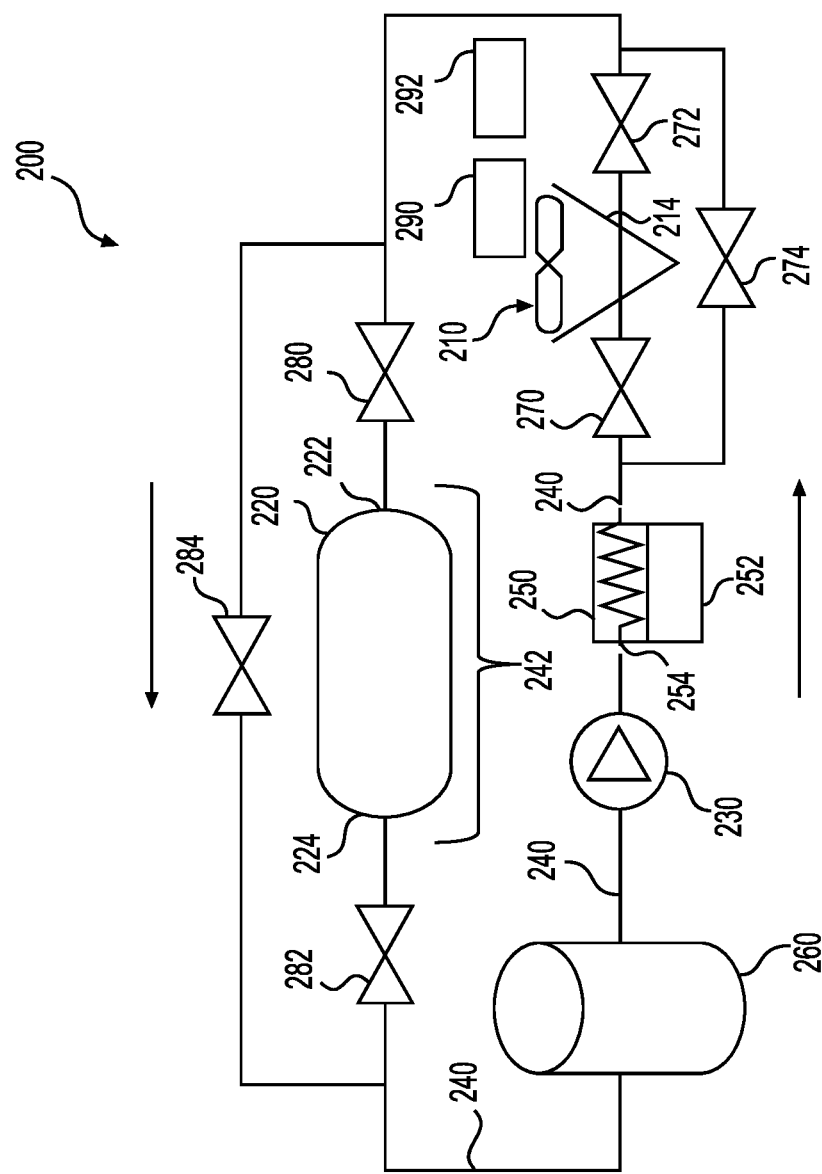
FIG. 2 is a schematic block diagram of a cooling system for an infrastructure in accordance with an embodiment of the present technology.

Specific embodiments of the cooling system 100 are illustrated in the following drawings. For example, FIG. 2 is a schematic block diagram of a cooling system for an infrastructure in accordance with an embodiment of the present technology. A cooling system 200 includes a plurality of internal cooling units 250, at least one of these internal cooling units 250 being thermally connected to each of a plurality of heat-generating units 252 of the infrastructure for transferring thermal energy from the heat-generating units 252 to the heat-transfer fluid in the internal cooling units 250. As in the case of FIG. 1, the heat-generating units 252 may each comprise, for example and without limitation a processor, a rack-mounted component, a complete rack, or a plurality of racks, each rack hosting a plurality of rack-mounted components that each include one or more processors. The internal cooling units 250 may comprise, for example and without limitation, fluid cooling devices mountable on processors and on other heat-generating components, water-to-water cooling units, air-to water cooling units, and the like. Non-limiting examples of internal cooling units are provided hereinbelow. Although FIG. 2 shows one internal cooling unit 250 and one heat-generating component 252, the infrastructure main contain any number of internal cooling units and any number of heat-generating components 252.

The cooling system 200 also includes an external cooling unit 210, for example a dry cooler or a group of dry coolers, a reservoir 220 containing PCM, a pump 230, and a cooling circuit 240 formed of a network of conduits. The cooling circuit 240 connects the external cooling unit 210 to the internal cooling units 250. The pump 230 is activable to maintain a flow of a heat-transfer fluid circulating in the cooling circuit 240 in a direction indicated by arrows on FIG. 2. The flow of heat-transfer fluid allows transferring thermal energy from the internal cooling units to the heat-transfer fluid. The external cooling unit 210, when activated, dissipates the thermal energy of the heat-transfer fluid. The reservoir 220 is thermally connected to a section 242 of the cooling circuit 240 extending between an inlet 222 and an outlet 224 of the reservoir 220. The section 242 may for example comprise a network of fluid passages (not shown) disposed within the reservoir 220 and arranged to prevent direct contact between the heat-transfer fluid and the PCM while providing a good thermal contact between the heat-transfer fluid and the PCM. The PCM changes from a solid state to a liquid state to transfer thermal energy from the cooling circuit 240 to the PCM when the temperature of the heat-transfer fluid flowing in the section 242 of the cooling circuit 240 reaches or exceeds the phase change temperature. The PCM changes from the liquid state to the solid state to dissipate thermal energy from the PCM when a temperature of the heat-transfer fluid flowing in the section 242 of the cooling circuit 240 is less than a phase change temperature value of the PCM. Non-limiting examples of PCM that may be stored in the reservoir 220 include paraffin wax, fatty acids, esters and salt hydrates. The thermal energy from the PCM may be transferred to the heat-transfer fluid or may be dissipated in the atmosphere, for example using a supplemental cooling device 300, which is described below. As illustrated, the section 142 of the cooling circuit 240 that is thermally connected to the reservoir 220 containing the PCM is positioned, within the cooling circuit 240, downstream of a cold outlet 214 of the external cooling unit 210 and upstream of cold inlets 254 of the internal cooling units 250 so that the external cooling unit 210 is first positioned to dissipate thermal energy contained in the heat-transfer fluid flowing in the cooling circuit 240.

As illustrated, the cooling system 200 further comprises a fluid storage tank 260 connected within the cooling circuit 240, upstream of the cold inlets 254 of the internal cooling units 250. The fluid storage tank 260 may act as a thermal buffer containing a large quantity of the cold heat-transfer fluid to complement the heat absorption capabilities of the internal cooling units 250, of the external cooling unit 210 and of the PCM contained in the reservoir 220. For example, when a capacity of the cooling system 200 exceeds the cooling requirements of the infrastructure, for example at night, the large quantity of the cold heat-transfer fluid present in the fluid storage tank 260 may supplement the capacity of the external cooling unit 210 and of the reservoir 220 in the daytime.

The cooling system 200 may also comprise a plurality of valves allowing isolating the external cooling unit 210, or the reservoir 220, or both. The cooling system 200 may be configured to cause the heat contained in the heat-transfer fluid to be dissipated solely by the external cooling unit 210, solely by the PCM contained in the reservoir 220, or at once by the external cooling unit 210 and by the PCM. For example, on a hot summer day, the external cooling unit 210 may become inefficient. One or two direct valves 270 and/or 272, positioned upstream and/or downstream of the external cooling unit 210 in the cooling circuit 240, may be closed by a controller 710 (FIG. 7) to isolate the external cooling unit 210 from the cooling circuit 240, for example to save energy by stopping internal fans (not shown) of the external cooling unit 210. At the same time, the controller 710 may cause a bypass valve 274 positioned in parallel to the external cooling unit 210 in the cooling circuit 240 to open, ensuring a continuity of the cooling circuit 240. At other times, the controller 710 may cause the direct valves 270 and/or 272 to open (if both the valves 270 and 272 are present, they are concurrently opened), placing the external cooling unit 210 within the cooling circuit 240 and allowing the external cooling unit to cool down the heat-transfer fluid. The controller 710 may at the same time cause the bypass valve 274 to close. In an embodiment, one of the valves 270 or 272 may be omitted. When both valves 270 and 272 are present, closing one of these valves may have the same or equivalent effect as closing both valves, so these valves may be considered redundant so that one valve may be operated if the other valve fails.

One or two direct valves 280 and/or 282, positioned upstream and/or downstream of the reservoir 220 containing the PCM in the cooling circuit 240, may be opened by the controller 710 to place the reservoir 220 within the cooling circuit 240, allowing a transfer of heat between the PCM and the heat-transfer fluid (if both valves 280 and 282 are present, they are concurrently opened). At the same time, the controller 710 may cause a bypass valve 284 positioned in parallel to the reservoir 220 in the cooling circuit 240 to close. At other times, the controller 710 may cause the direct valves 280 and/or 282 to close in order to isolate the reservoir 220 from the cooling circuit 240 and to prevent a transfer of heat between the PCM and the heat-transfer fluid, the controller 710 concurrently causing the bypass valve 284 to open to ensure a continuity of the cooling circuit 240. In an embodiment, one of the valves 280 or 282 may be omitted. When both valves 280 and 282 are present, closing one of these valves may have the same or equivalent effect as closing both valves, so these valves may be considered redundant so that one valve may be operated if the other valve fails.

Opening and closing of the valves 270, 272, 274, 280, 282 and 284 under the control of the controller 710 may be effected at predetermined times, for example to activate the external cooling unit 210 and deactivate the reservoir 220 containing the PCM at sunset and to deactivate the external cooling unit 210 and activate the reservoir 220 containing the PCM at sunrise. To this end, a timing function (not shown) may be implemented in the controller 710.

Alternatively, the controller 710 may use measurements from one or more sensors to control the valves 270, 272, 274, 280, 282 and 284. For example, an ambient temperature sensor 290 and an ambient humidity sensor (hygrometer) 292 may be disposed in the vicinity of the infrastructure, being disposed for example close to the external cooling unit 210. The ambient temperature sensor 290 provides an ambient temperature measurement to the controller 710 and the ambient humidity sensor 292 sensor provides an ambient humidity measurement to the controller 710. The controller 710 may cause the direct valves 270 and/or 272 to open and cause the bypass valve 274 to close when the ambient temperature at the infrastructure is less than a first predetermined temperature threshold. The controller 710 may cause the direct valves 270 and/or 272 to close and cause the bypass valve 274 to open when the ambient temperature at the infrastructure meets or exceeds the first predetermined temperature threshold. This first predetermined temperature threshold may for example be determined based on experimentations revealing that an efficiency of the external cooling unit 210 no longer meets expectations when the first predetermined temperature threshold is exceeded. Likewise, the controller 710 may cause the direct valves 280 and/or 282 to close and cause the bypass valve 284 to open when the ambient temperature at the infrastructure is less than a second predetermined temperature threshold. The controller 710 may also cause the direct valves 280 and/or 282 to open and cause the bypass valve 284 to close when the ambient temperature at the infrastructure meets or exceeds the second predetermined temperature threshold. This second predetermined temperature threshold may for example be determined based on experimentations revealing that the external cooling unit 210 cannot by itself meet efficiency targets for the cooling system 200 when the second predetermined temperature threshold is exceeded. Alternatively, the second predetermined temperature threshold may correspond to a phase change temperature of the PCM. In a non-limiting embodiment, the first and second predetermined temperature thresholds may be identical. In the same or another non-limiting embodiment, a particular PCM may be selected so that its phase change temperature is close to the temperature at which the efficiency of the external cooling unit 210 no longer meets the efficiency targets for the cooling system 200.

It may be noted that, in an embodiment, the controller 710 may cause the direct valves 270 and 272 to close and the bypass valve 274 to open at the same time as it causes the direct valves 280 and 282 to open and the bypass valve 284 to close. Under this first set of conditions, the external cooling unit 210 is effectively taken out of the cooling circuit 240 and inactivated while the reservoir 220 containing the PCM is included in the cooling circuit 240 and activated. At other times, the controller 710 may cause the direct valves 270 and 272 to open and the bypass valve 274 to close at the same time as it causes the direct valves 280 and 282 to close and the bypass valve 284 to open. Under this second set of conditions, the external cooling unit 210 is included in the cooling circuit 240 and activated while the reservoir 220 containing the PCM is effectively taken out of the cooling circuit 240 and inactivated. At still other times, the controller 710 may cause the direct valves 270 and 272 to open and the bypass valve 274 to close at the same time as it causes the direct valves 280 and 282 to open and the bypass valve 284 to close. Under this third set of conditions, the external cooling unit 210 and the reservoir 220 containing the PCM are both included in the cooling circuit 240 and activated, for example and without limitation to allow recharging the PCM in the nighttime. Other configurations of the valves 270, 272, 274, 280, 282 and 284 may cause a complete bypass of the external cooling unit 210 and of the reservoir 220 containing the PCM, or a complete stoppage of a flow of heat-transfer fluid in the cooling circuit 240, potentially resulting in a total loss of cooling for the infrastructure. These other configurations may therefore be considered unsafe.

Figure 3:
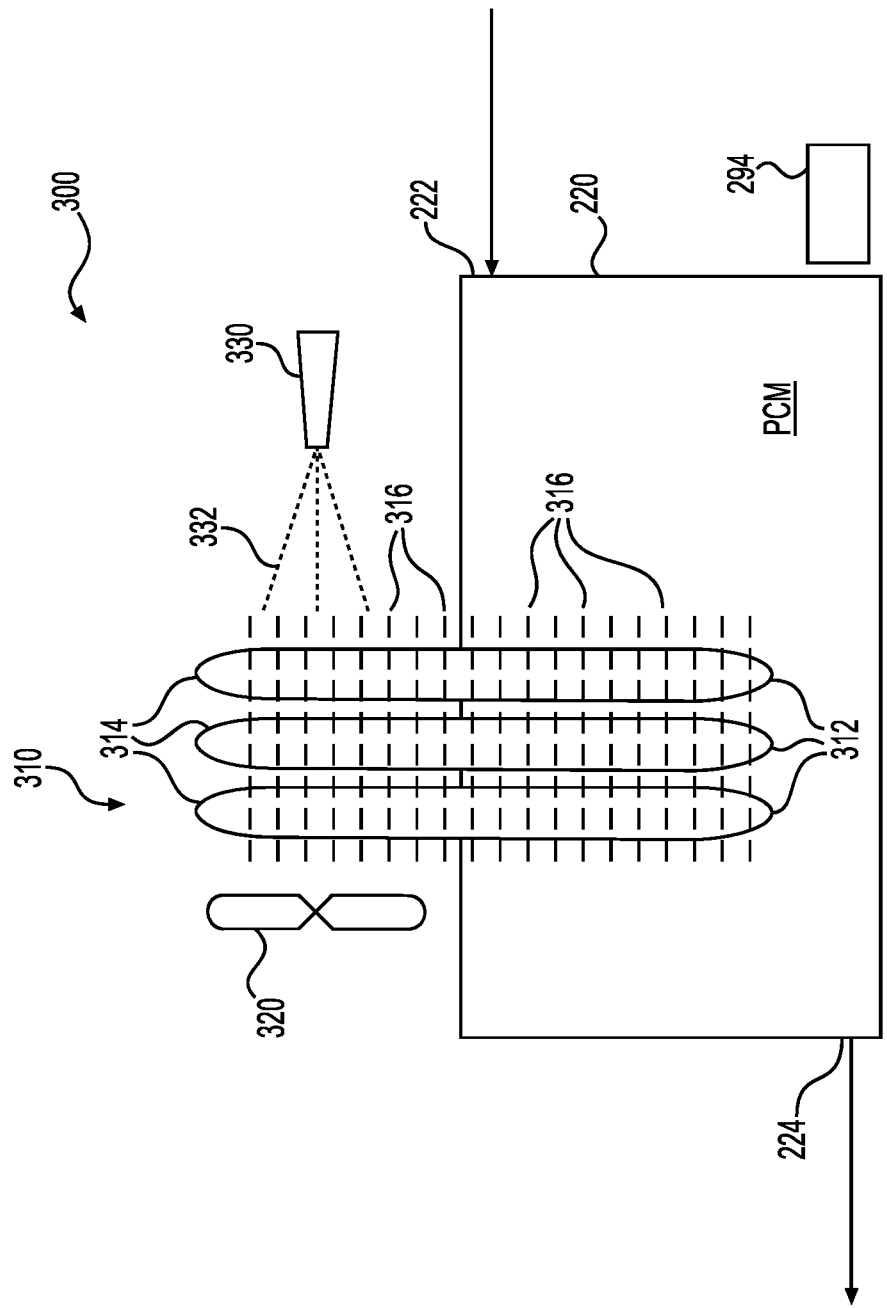
FIG. 3 is a schematic block diagram of supplemental cooling device in accordance with an embodiment of the present technology.

The PCM contained in the reservoir 220 is able to passively absorb thermal energy from the heat-transfer fluid, without consuming any energy. In especially harsh conditions, the heat absorption capability of the PCM, used alone or in combination with the external cooling unit 210, may not suffice to bring the heat-transfer fluid to a desired low temperature. FIG. 3 is a schematic block diagram of supplemental cooling device in accordance with an embodiment of the present technology. A supplemental cooling device 300 is thermally connected to the reservoir 220 containing the PCM. The supplemental cooling device 300 is configured to dissipate heat from the reservoir 220 containing the PCM to the atmosphere. The supplemental cooling device 300 may provide additional cooling capability to the cooling system 200 in particularly harsh conditions, such as when the infrastructure is in full operation while the external cooling unit is exposed to sunlight. The supplemental cooling device 300 may facilitate recharging of the PCM at night by increasing a speed of dissipation of the thermal energy contained in the PCM when in the liquid state. In the embodiment illustrated on FIG. 3, the supplemental cooling device 300 comprises an array of heat pipes 310 extending from the reservoir 220 containing the PCM. Each heat pipe 310 includes an evaporator portion 312 disposed within the reservoir 220 so that they have a good thermal contact with the PCM, and an externally positioned condenser portion 314. Fins 316 may be provided on the heat pipes 310 to enhance thermal transfer between the PCM and the evaporator portions 312, and/or between the condenser portions 314 and the atmosphere. Instead of the heat pipes 310, the supplemental cooling device 300 may include an array of loop heat pipes, an array of capillary pumped loops, or an array of thermosiphons, which extends from the reservoir containing the PCM.

One or more external fans 320 (one external fan 320 is shown for simplicity) may direct air to or from the condenser portions 314 for enhanced cooling. One or more sprayers 330 (on sprayer 330 is shown for simplicity) may direct water droplets 332 toward the condenser portions 314 to provide evaporative cooling. The fans 320 and the sprayers 330 may be used concurrently to form an evaporative cooling system directing the water droplets 332 toward the condenser portions 314 of the heat pipes 310.

It is contemplated that the supplemental cooling device 300 may use other technologies to provide cooling for the PCM contained in the reservoir 220. For example and without limitation, the supplemental cooling device 300 may include one or more of a dry cooler, one or more fans, a geothermal cooling system, and a fatal energy recovery system.

In an embodiment, the controller 710 may use the ambient temperature measurement from the ambient temperature sensor 290 and the ambient humidity measurement from the ambient humidity sensor 292 to control activation of the supplemental cooling device 300. The controller 710 may initiate operation of the fans 320 and of the sprayers 330 of the evaporative cooling system when the ambient temperature at the infrastructure meets or exceeds a third predetermined temperature threshold, this threshold being dependent on the ambient humidity. The controller 710 may also initiate operation of the dry cooler, the one or more fans, the geothermal cooling system, or the fatal energy recovery system when an ambient temperature at the infrastructure meets or exceeds a fourth predetermined temperature threshold.

The third and fourth predetermined temperature thresholds may be set in view of the phase change temperature value of the PCM so that a cooling efficiency of the supplemental cooling device 300 is increased when the PCM is at least partially in the liquid state. The third and fourth predetermined temperature thresholds may have identical or different values.

In another embodiment, the PCM temperature sensor 294 may provide to the controller 710 a measurement of a current temperature of the PCM in the reservoir 220. The controller 710 may initiate operation of the various components of the supplemental cooling device 300 when the PCM temperature sensor 294 indicates that the current temperature of the PCM meets or exceeds a fifth temperature threshold, which may for example be slightly lower than the phase change temperature of the PCM.

In a non-limiting embodiment of the cooling system 200, the direct valves 280 and/or 282 are closed and the bypass valve 284 is open to take the reservoir 220 outside of the cooling circuit 240 when the ambient temperature measured by the ambient temperature sensor 290 is less than the first predetermined temperature threshold, which may vary according to the ambient humidity measured by the ambient humidity sensor 292, the external cooling unit 210 being activated. Under such conditions, the PCM contained in the reservoir 220 is not exposed to the heat-transfer fluid expelled at the cold outlet 214 of the external cooling unit 210 and only the supplemental cooling device 300 is used to charge the PCM. For that reason, the third and fourth predetermined temperature thresholds may be set to lower ambient temperature values than the first predetermined temperature threshold. These restrictions to the setting of the third and fourth predetermined temperature thresholds do not apply when the external cooling unit 210 and the reservoir 220 are concurrently placed in the cooling circuit 240.

Figure 4:
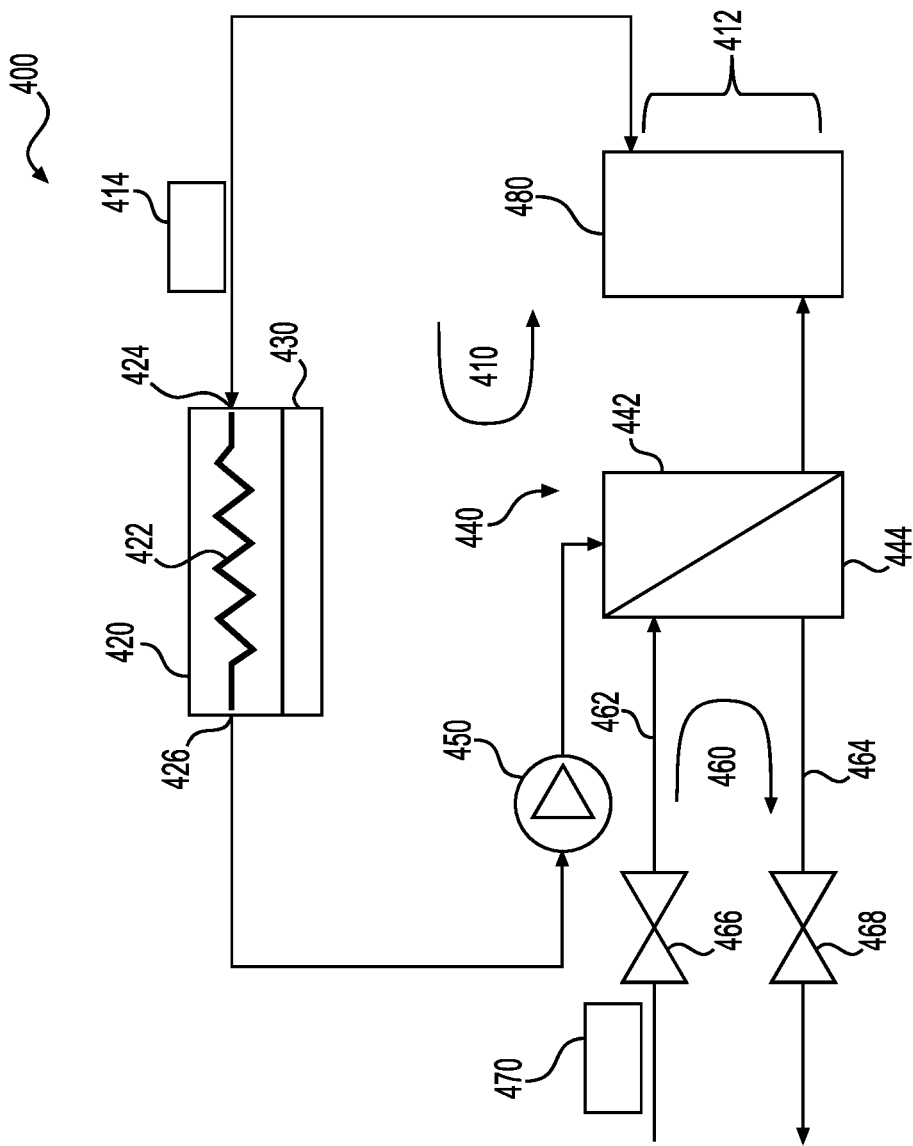
FIG. 4 is a schematic block diagram of a cooling arrangement for autonomous cooling of a rack hosting at least one component in accordance with an embodiment of the present technology.

FIG. 4 is a schematic block diagram of a cooling arrangement for autonomous cooling of a rack hosting at least one component in accordance with an embodiment of the present technology. A cooling arrangement 400 is another variation of the cooling system 100 of FIG. 1. The cooling arrangement 400 comprises a closed loop cooling circuit 410 and an open loop cooling circuit 460. The closed loop cooling circuit 410 comprises at least one fluid cooling unit 420 (one fluid cooling unit 420 is shown for simplicity) thermally coupled to at least one heat-generating component 430 (one heat-generating component 430 is shown for simplicity) mounted in a rack (not shown). The fluid cooling unit 420 comprises a fluid channel 422 extending being a cold inlet 424 and a hot outlet 426. Heat from the heat-generating component 430 is transferred to a first fluid, for example and without limitation water, flowing in the fluid channel 422. The closed loop cooling circuit 410 also comprises a primary side 442 of a fluid-to-fluid heat exchanger 440. The primary side 442 is fluidly connected to the fluid channel 422 of the fluid cooling unit 420. A pump 450 is fluidly connected between the primary side 442 of the fluid-to-fluid heat exchanger 440 and to the fluid cooling unit 420. The pump 450 causes the first fluid to flow in the direction indicated by arrow within the closed loop cooling circuit 410.

The open loop cooling circuit 460 comprises a secondary side 444 of the fluid-to-fluid heat exchanger 440. The secondary side 444 is thermally coupled to the primary side 442 for transfer of heat from the primary side 442 to the secondary side 444 when a temperature of the primary side 442 is higher than a temperature of the secondary side 444. The secondary side 444 receives a second fluid, for example and without limitation water, from a cold supply line 462 fluidly connected to a cold outlet of an external cooling unit (for example the external cooling unit 210) and to return the second fluid to a hot return line 464 fluidly connected to a hot inlet of the external cooling unit.

The cooling arrangement 400 also comprises a reservoir 480 containing PCM. The reservoir 480 is thermally connected to a section 412 of the closed loop cooling circuit 410. As illustrated, the reservoir 480 containing the PCM is thermally connected to a cold outlet 446 of the primary side 442 of the fluid-to-fluid heat exchanger 440 and to the cold inlet 424 of the fluid cooling unit 420. The section 412 may for example comprise a network of fluid passages (not shown) disposed within the reservoir 480 and arranged to prevent direct contact between the first fluid and the PCM while providing a good thermal contact between the first fluid and the PCM. The PCM changes from a liquid state to a solid state to transfer thermal energy from the PCM to the closed loop cooling circuit 410 when a temperature of the first fluid flowing in the section 412 of the closed loop cooling circuit 410 is less than a phase change temperature of the PCM, the PCM being fully charged when entirely in solid state. Conversely, the PCM changes from the solid state to the liquid state to transfer thermal energy from the closed loop cooling circuit 410 to the PCM when the temperature of the first fluid flowing in the section 412 of the closed loop cooling circuit 410 reaches or exceeds the phase change temperature, the PCM being fully discharged when entirely in liquid state. Non-limiting examples of PCM that may be stored in the reservoir 480 include paraffin wax, fatty acids, esters and salt hydrates.

In an embodiment, the cooling arrangement 400 is configured to be autonomous under normal operating conditions. The cooling arrangement 400 includes the controller 710 (FIG. 7), a closed loop temperature sensor 414 measuring a temperature of the first fluid supplied to the cold inlet 424 of the fluid cooling unit 420 and one or two valves 466 and/or 468 connected to the cold supply 462 line or to the hot return line 464. The controller 710 receives a measured temperature of the first fluid from the closed loop temperature sensor 414. The controller 710 may cause the valves 466 and/or 468 to close when the measured temperature of the first fluid is less than a first high temperature threshold. When the valves 466 and/or 468 are closed, the cooling arrangement 400 operates in an autonomous fashion, providing cooling for the fluid cooling unit 420 without any external assistance other than a possible gradual discharge of the PCM contained in the reservoir 480. The controller 710 may cause the valves 466 and/or 468 to open (if both valves 466 and 468 are present, they are concurrently opened) when the measured temperature of the first fluid meets or exceeds the first high temperature threshold. When the valves 466 and/or 468 are opened, the cooling capacity of the cooling arrangement 400 is increased, allowing to maintain a safe temperature of the heat-generating component 430 and to charge the PCM contained in the reservoir 480.

In another embodiment, the cooling arrangement 400 is configured to operate with support of the external cooling unit under normal operating conditions. The controller 710 causes the valves 466 and/or 468 to remain open under normal operating conditions of the external cooling unit. The controller 710 may cause the valves 466 and/or 468 to close under abnormal operating conditions of the external cooling unit. In particular, the cooling arrangement may include an open loop temperature sensor 470 measuring a temperature of the second fluid supplied by the cold supply. The controller 710 may receive a measured temperature of the second fluid from the open loop temperature sensor 470 and cause the valves 466 and/or 468 to open when the measured temperature of the second fluid is less than a second high temperature threshold so that the cooling arrangement 400 may operate with support of the external cooling unit. However, the controller 710 may cause the valves 466 and/or 468 to close when the measured temperature of the second fluid meets or exceeds the second high temperature threshold. The closed loop 410 then operates in rescue mode with the PCM contained in the reservoir 480 discharging and assuring cooling of the fluid cooling unit 420 for a predetermined amount of time, until the PCM is fully discharged.

It may be noted that, in either embodiments, should delivery of the second fluid at via the cold supply line 462 fail due to conditions external to the cooling arrangement 400, the cooling arrangement 400 remains capable of absorbing heat generated by the heat-generating component 430 for an extended period, until the PCM contained in the reservoir 480 is fully discharged. A size of the reservoir 480 and a nature of the PCM contained therein may be selected according to an expected level of heat generated by the heat-generating component 430 and according to a desired autonomy duration for the cooling arrangement 400.

When the cooling arrangement 400 provides cooling for a plurality of heat-generating components 430 using a plurality of fluid cooling units 420, a part of the closed loop cooling circuit 410 extending between the reservoir 480 and the pump 430 is split by a manifold device (not shown) in a corresponding plurality of smaller cooling circuits (not shown) reaching each of the fluid cooling units 420. The manifold device may have a 1:N port and a N:1 port, in which N is a number of the fluid cooling units 420. The 1:N port splits the closed loop cooling circuit 410 into N smaller cooling circuits connected to the N fluid cooling units 420. The N smaller cooling circuits are then regrouped into the closed loop cooling circuit 410 at the N:1 port. In such case, the closed loop temperature sensor 414 may be positioned downstream of the reservoir 480 and upstream of the 1:N port.

Considering FIGS. 2 and 4, in an embodiment, the cooling arrangement 400 and the heat-generating component 430 (or pluralities of cooling arrangements 400 and of heat-generating components 430) may be combined to form the internal cooling units 250 and the heat-generating units 252. Heat generated inside the infrastructure by the heat-generating components 430 may be evacuated by the cooling arrangements 400 via the hot return line 464 to the cooling circuit 240, in order to be externally dissipated to the atmosphere by the cooling system 200. The fluid flowing in the cooling circuit 240 having been cooled by the cooling system 200 may then be supplied to the cooling arrangement 400 via the cold supply line 462. In this embodiment, the reservoir 480 may be filled with a PCM having a higher phase change temperature than the PCM contained in the reservoir 220.

Figure 5:
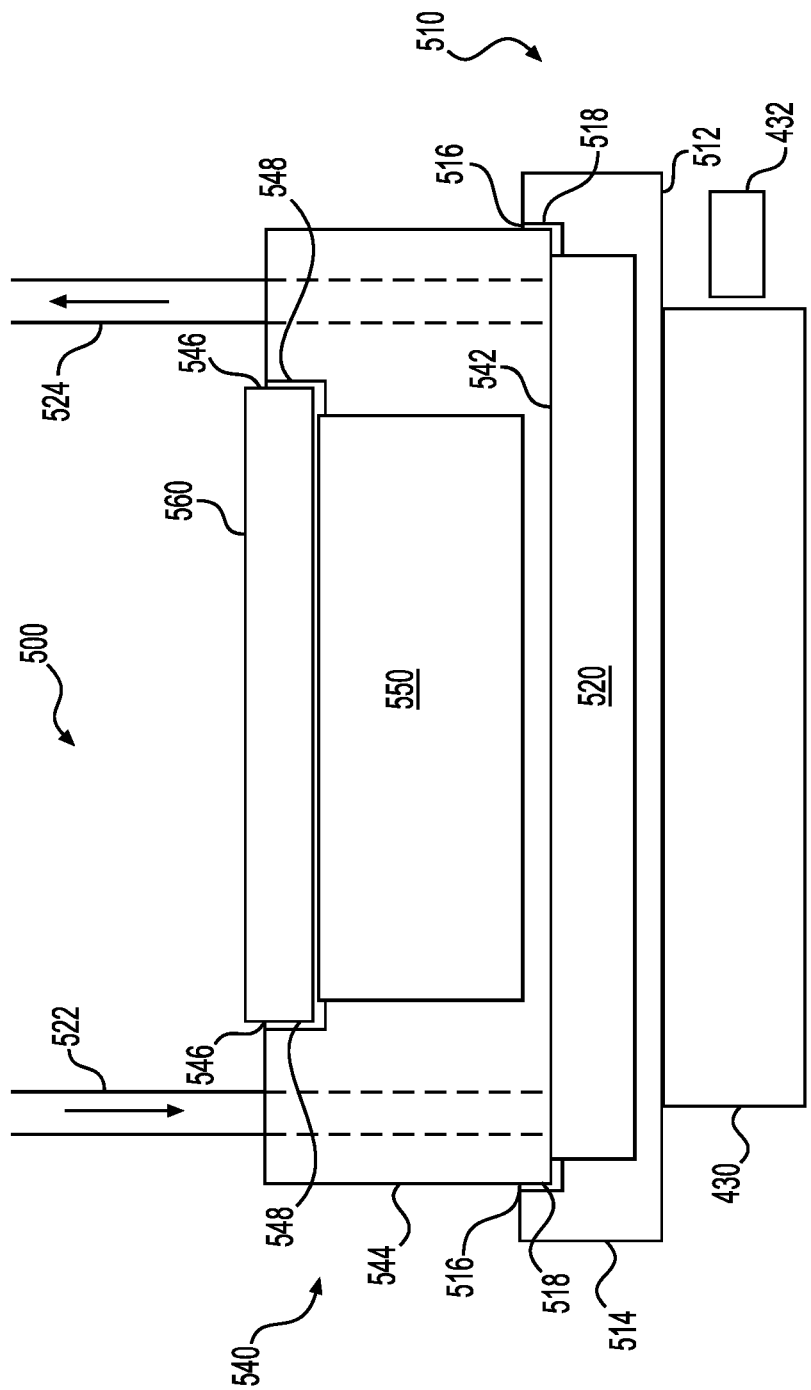
FIG. 5 is a schematic, cross-sectional block diagram of a cooling device mountable on a heat-generating component in accordance with an embodiment of the present technology.

FIG. 5 is a schematic, cross-sectional block diagram of a cooling device mountable on a heat-generating component in accordance with an embodiment of the present technology. A cooling device 500 is mountable on the heat-generating component 430 introduced in the description of FIG. 4 or on another heat-generating component, for example a processor, a graphical processing unit, and the like. The heat-generating component 430 may be mounted on a server, the server being installed in a rack of a datacenter or another infrastructure. The cooling device 500 comprises a first casing 510 adapted for direct mounting on the heat-generating component 430 and a second casing 540 mounted on the first casing 510.

The first casing 510 comprises a closed face 512 adapted for mounting on the heat-generating component 430, a closed peripheral structure 514 extending from the first closed face 512, and an open face defined by edges 516 of the closed peripheral structure 514 opposite from the closed face 512. The second casing 540 comprises a closed face 542 sealingly connected, for example welded, to the edges 516 of the closed peripheral structure 514 of the first casing 510 to seal the open face of the first casing 510. The second casing 540 also comprises a closed peripheral structure 544 extending from the closed face 542, and an open face defined by edges 546 of the closed peripheral structure 544 opposite from the closed face 542. An insulator plate 560 is sealingly connected, for example welded, to the edges 546 of the closed peripheral structure 544 to seal the open face of the second casing 540. As illustrated, the first casing 510 comprises an indentation 518 near the edges 516 of the closed peripheral structure 514, the indentation 518 being adapted for mating with an outer periphery of the second casing 540 at the bottom of its closed peripheral structure 544. The second casing also comprises an indentation 548 near the edges 546 of the closed peripheral structure 544, the indentation 548 being adapted for mating with the insulator plate 560. Although not shown on the cross-sectional view of FIG. 5, the first and second casings 510 and 540 may have rectangular, square or circular perimeters.

The first casing 510 includes an internal channel 520 connected to a cold inlet 522 and to a hot outlet 524 allowing a heat-transfer fluid to flow in the internal channel 520. The heat-transfer fluid, for example water, may flow in a direction illustrated with arrows on FIG. 5. The second casing 540 includes a storage 550 containing a PCM. Non-limiting examples of PCM that may be stored in the storage 550 include paraffin wax, fatty acids, esters and salt hydrates.

As illustrated, the cold inlet 522 and the hot outlet 524 pass through the peripheral structure 544 and the closed face 542 of the second casing 520 to reach the internal channel 520 in the first casing 510. The internal channel 520 is located between the closed face 512 of the first casing 510 and the closed face 542 of the second casing 540. The storage 550 containing the PCM is located between the closed face 542 of the second casing 540 and the insulator plate 560.

The PCM may change from a solid state to a liquid state to transfer thermal energy from the heat-generating unit 430 to the PCM when a temperature in the storage 550 exceeds a phase-change temperature for the PCM. The PCM may change from the liquid state to the solid state to transfer thermal energy from the PCM to the heat-transfer fluid when the flow of heat-transfer fluid in the internal channel 512 causes the temperature in the storage 550 to fall below the phase-change temperature.

An example of a method for cooling the heat-generating component 430 comprises mounting the cooling device 500 on the heat-generating component 430 and initiating a flow of heat-transfer fluid in the internal channel 520. The flow of heat-transfer fluid is normally maintained in the internal channel 520 to maintain a temperature of the cooling device 500, particularly a temperature of the PCM in the storage 550, below the phase-change temperature, in order to maintain the PCM in the solid state. If the flow of heat-transfer fluid is stopped for any reason, the PCM gradually will change from the solid state to the liquid state to temporarily absorb heat dissipated by the heat-generating component 430. It may be noted that when the flow of heat-transfer fluid is stopped, heat-transfer fluid already present in the internal channel 520 may facilitate the transfer of heat from the heat-generating component 430 through the closed face 512 of the first casing and through the internal channel 520 up to the second casing 540. A temperature sensor 432, integrated in or connected to the heat-generating component 430, may provide a measurement of a temperature of the heat-generating component 430 to the controller 710. The controller 710 may use this measurement for monitoring purposes or to control restarting the flow of heat-transfer fluid in the first casing 510 of the cooling device 500.

Figure 6:
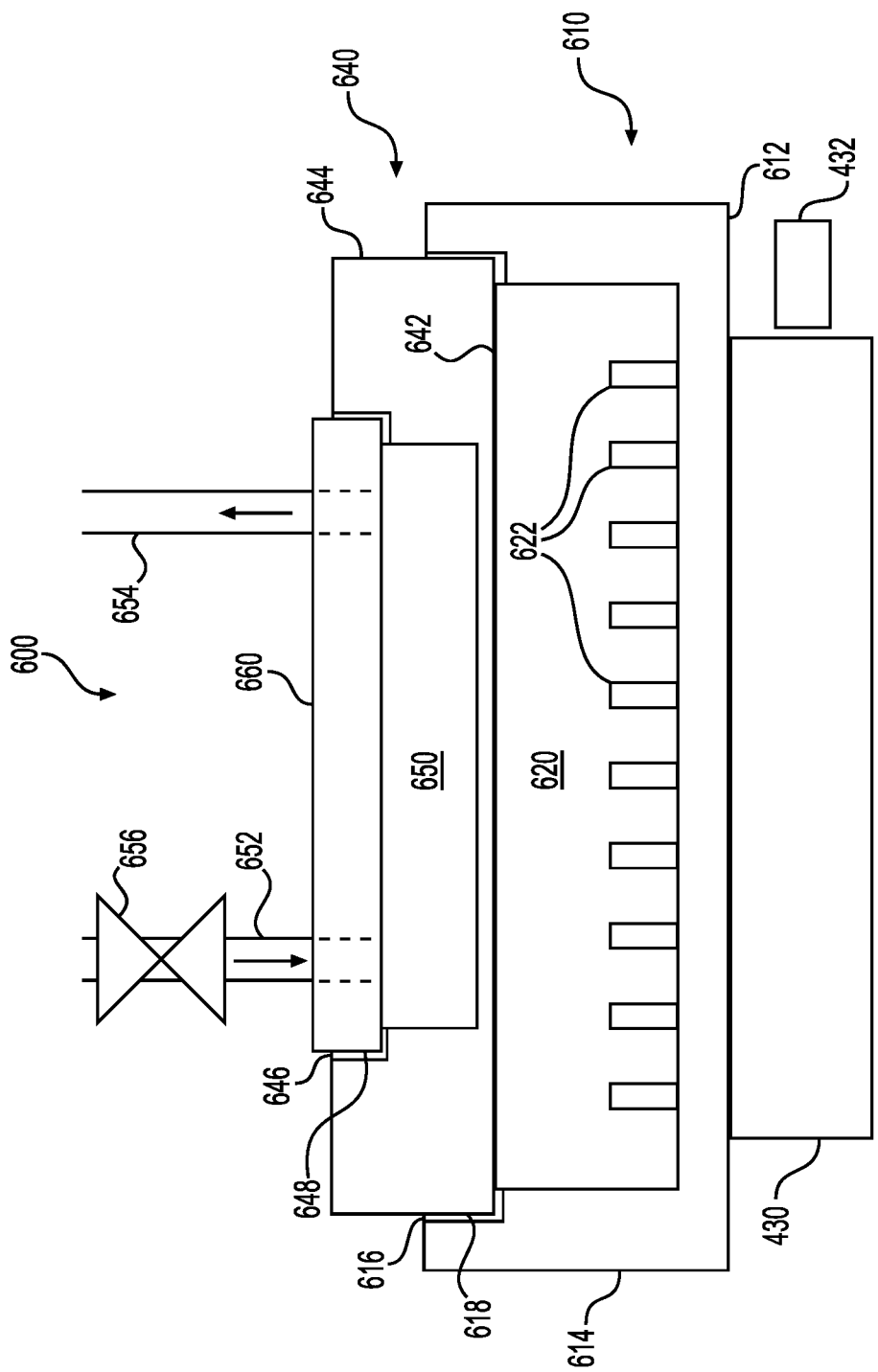
FIG. 6 is a schematic, cross-sectional block diagram of another cooling device mountable on a heat-generating component in accordance with an embodiment of the present technology.

FIG. 6 is a schematic, cross-sectional block diagram of another cooling device mountable on a heat-generating component in accordance with an embodiment of the present technology. A cooling device 600 is mountable on the heat-generating component 430 introduced in the description of FIG. 4 or on another heat-generating component, for example a processor, a graphical processing unit, and the like. The heat-generating component 430 may be mounted on a server, the server being installed in a rack of a datacenter or another infrastructure. The cooling device 600 comprises a first casing 610 adapted for direct mounting on the heat-generating component 430 and a second casing 640 mounted on the first casing 610.

The first casing 610 comprises a closed face 612 adapted for mounting on the heat-generating component 430, a closed peripheral structure 614 extending from the first closed face 612, and an open face defined by edges 616 of the closed peripheral structure 614 opposite from the closed face 612. The second casing 640 comprises a closed face 642 sealingly connected, for example welded, to the edges 616 of the closed peripheral structure 614 of the first casing 610 to seal the open face of the first casing 610. The second casing 640 also comprises a closed peripheral structure 644 extending from the closed face 642, and an open face defined by edges 646 of the closed peripheral structure 644 opposite from the closed face 642. An insulator plate 660 is sealingly connected, for example welded, to the edges 646 of the closed peripheral structure 644 to seal the open face of the second casing 640. As illustrated, the first casing 610 comprises an indentation 618 near the edges 616 of the closed peripheral structure 614, the indentation 618 being adapted for mating with an outer periphery of the second casing 640 at the bottom of its closed peripheral structure 644. The second casing also comprises an indentation 648 near the edges 646 of the closed peripheral structure 644, the indentation 648 being adapted for mating with the insulator plate 660. Although not shown on the cross-sectional view of FIG. 6, the first and second casings 610 and 640 may have rectangular, square or circular perimeters.

The first casing 610 includes a storage 620 containing a PCM. Non-limiting examples of PCM that may be stored in the storage 620 include paraffin wax, fatty acids, esters and salt hydrates. The second casing 640 includes an internal channel 650 connected to a cold inlet 652 and to a hot outlet 654 allowing a heat-transfer fluid to flow in the internal channel 650. The heat-transfer fluid, for example water, may flow in a direction illustrated with arrows on FIG. 6. A valve 656 connected to the cold inlet 652 may be used to control the flow of heat-transfer fluid in the internal channel 650. It is contemplated that the valve 656 may be connected to the hot outlet 654, or a valve could be connected to each of the cold inlet 652 and hot outlet 654.

As illustrated, the cold inlet 652 and the hot outlet 654 pass through the insulator plate 660. The storage 620 containing the PCM is located between the closed face 612 of the first casing 610 and the closed face 642 of the second casing 640. The internal channel 650 is located between the closed face 642 of the second casing 640 and the insulator plate 660. A plurality of fins 622 may extend within the storage 620 containing the PCM, from the closed face 612 of the first casing 610, to enhance the transfer of heat from the heat-generating component 430 to the PCM.

In the first casing 610, the PCM may change from a solid state to a liquid state to transfer thermal energy from the heat-generating unit 430 to the PCM when the temperature in the storage 620 exceeds a phase-change temperature for the PCM. The PCM may change from the liquid state to the solid state to transfer thermal energy from the PCM to the heat-transfer fluid when the flow of heat-transfer fluid in the internal channel 650 causes the temperature in the storage 620 to fall below the phase-change temperature. In practice, the temperature of the PCM may vary in strata defined between the closed face 612 of the lower casing 610 and the closed face 642 of the upper casing 640. As such, the PCM may continuously change from the solid state to the liquid state in a lower stratum, to transfer thermal energy from the heat-generating unit 430 to the PCM, while the PCM is continuously changing from the liquid state to the solid state in an upper stratum to transfer thermal energy from the PCM to the heat-transfer fluid. A natural convection motion lets the PCM in liquid state raise and the PCM in solid state fall, due to their difference in temperature and density.

An example of a method for cooling the heat-generating component 430 comprises mounting the cooling device 600 on the heat-generating component 430 and initiating a flow of heat-transfer fluid in the internal channel 650. The flow of the heat-transfer fluid is normally maintained in the internal channel 650 to maintain a temperature of the cooling device 600, particularly a temperature of the PCM in the storage 620, below the phase-change temperature, in order to maintain the PCM in the solid state. If the flow of heat-transfer fluid is stopped for any reason, the PCM gradually will change from the solid state to the liquid state to temporarily absorb heat dissipated by the heat-generating component 430. As the state of the PCM may be stratified in normal operating conditions, the PCM is mainly in the liquid state in the lower stratum of the storage 620 proximate to the heat-generating component 430, the PCM being mainly in the solid state in the upper stratum of the storage 620 proximate to the internal channel 650. In that case, when the flow of the heat-transfer fluid is stopped for any reason, the PCM in the upper stratum of the storage 620 gradually changes from the solid state to the liquid state to temporarily absorb heat dissipated by the heat-generating component 430. A temperature sensor 432, integrated in or connected to the heat-generating component 430, may provide a measurement of a temperature of the heat-generating component 430 to the controller 710. The controller 710 may use this measurement for monitoring purposes or to control restarting the flow of heat-transfer fluid in the second casing 640 of the cooling device 600.

A further example of a method for cooling the heat-generating component 430 comprises mounting the cooling device 600 on the heat-generating component 430 and operating the cooling device 600 autonomously without a flow of heat-transfer fluid in the internal channel. Although the fluid channel 650 may be empty at that time, the heat absorption capability of the PCM may suffice to maintain a safe temperature of the heat-generating component. The temperature of the heat-generating component 430 is monitored by the controller 710 using measurements from the temperature sensor 432. If the controller 710 detects an increase of a temperature of the heat-generating component 430, the controller 710 may initiate a flow of heat-transfer fluid in the internal channel 650. The controller 710 may initiate the flow of heat-transfer fluid when the temperature of the heat-generating component 430 exceeds a safe temperature for the heat-generating component 430.

Considering FIGS. 2, 5 and 6, in an embodiment, the cooling device 500 and/or 600 and the heat-generating component 430 (or pluralities of cooling devices 500 and/or 600 and of heat-generating components 430) may be combined to form the internal cooling units 250 and the heat-generating units 252. Heat generated inside the infrastructure by the heat-generating components 430 may be evacuated by the cooling devices 500 or 600 via the hot return line 464 to the cooling circuit 240, in order to be externally dissipated to the atmosphere by the cooling system 200. The fluid flowing in the cooling circuit 240 having been cooled by the cooling system 200 may then be supplied to the cooling devices 500 or 600 via the cold supply line 462. In this embodiment, the storage 550 or 620 may be filled with a PCM having a higher phase change temperature than the PCM contained in the reservoir 220.

Alternatively, considering FIGS. 4, 5 and 6, the cooling device 500 and/or 600 may be mounted in the cooling arrangement 400, where the fluid cooling unit 420 is illustrated, whether or not the cooling arrangement 400 is operated with the cooling system 200.

Figure 7:
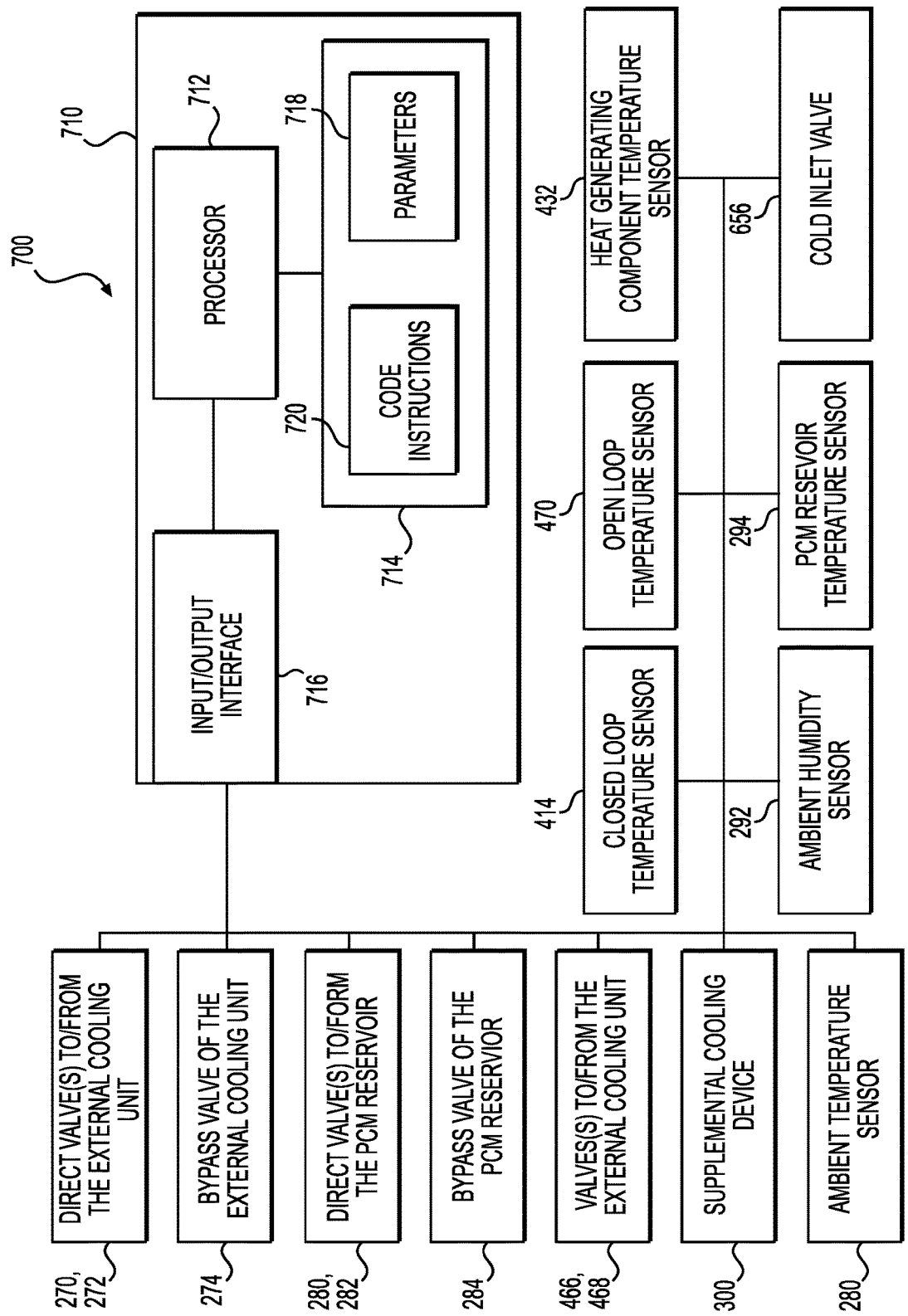
FIG. 7 is a schematic block diagram of a control system for operating one or more of the cooling system of FIG. 2, the supplemental cooling device of FIG. 3, and the cooling arrangement of FIG. 4 in accordance with an embodiment of the present technology.

FIG. 7 is a schematic block diagram of a control system for operating one or more of the cooling system of FIG. 2, the supplemental cooling device of FIG. 3, and the cooling arrangement of FIG. 4 in accordance with an embodiment of the present technology. On FIG. 7, a control system 700 includes the controller 710 having a processor or a plurality of cooperating processors (represented as a processor 712 for simplicity), a memory device or a plurality of memory devices (represented as a memory device 714 for simplicity), an input/output device or a plurality of input/output devices (represented as an input/output device 716 for simplicity). Separate input devices and output devices (not shown) may be present instead of the input/output device 716. The processor 712 is operatively connected to the memory device 714 and to the input/output device 716. The memory device 714 includes a storage 718 for storing parameters, including for example the above-mentioned predetermined temperature thresholds. The memory device 714 may comprise a non-transitory computer-readable medium 720 for storing instructions that are executable by the processor 712.

The processor 712 is operatively connected, via the input/output interface 716, to those of the sensors 290, 292, 294, 414, 470 and 432 and to those of the valves 270, 272, 274, 280, 282, 284, 466, 468 and 656 that may be present in a particular embodiment. The processor 712 executes the instructions stored in the medium 720 to implement the various above-described functions of the controller 710 that may be present in a particular embodiment.

FIG. 7 as illustrated represents a non-limiting embodiment in which the controller 710 receives measurements from each of the sensors 290, 292, 294, 414, 470 and 432, and controls all of the valves 270, 272, 274, 280, 282, 284, 466, 468 and 656 accordingly, further controlling operation of the supplemental cooling device 300 and its components. This particular embodiment is not meant to limit the present disclosure and is provided for illustration purposes. A given implementation may include one or any combination of the cooling system 200 of FIG. 2, the supplemental cooling device 300 of FIG. 3, the cooling arrangement 400 of FIG. 4, the cooling device 500 of FIG. 5 and/or the cooling device 600 of FIG. 6. As such, only some of the temperature sensors, valves, and supplemental cooling device may be included in a particular embodiment.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

As such, the method, system and datacenter systems implemented in accordance with some non-limiting embodiments of the present technology can be represented as follows, presented in numbered clauses.

Clauses

[Clause 1] A cooling system for an infrastructure having a plurality of heat-generating units, comprising:
- a plurality of internal cooling units, at least one cooling unit of the plurality of internal cooling units being thermally connected to each of the plurality of heat-generating units for transferring thermal energy from the heat-generating units to the cooling units;
- an external cooling unit;
- a cooling circuit connecting the plurality of internal cooling units and the external cooling unit;
- a pump configured to maintain a flow of a heat-transfer fluid circulating in the cooling circuit, allowing to transfer thermal energy from the plurality of internal cooling units to the heat-transfer fluid and to transfer thermal energy from the heat-transfer fluid to the external cooling unit; and
- a reservoir containing a phase change material (PCM), the reservoir being thermally connected to a section of the cooling circuit, the PCM changing from a liquid state to a solid state to transfer thermal energy from the PCM to the cooling circuit when a temperature of the heat-transfer fluid flowing in the section of the cooling circuit is less than a phase change temperature value of the PCM, the PCM changing from the solid state to the liquid state to transfer thermal energy from the cooling circuit to the PCM when the temperature of the heat-transfer fluid flowing in the section of the cooling circuit reaches or exceeds the phase change temperature.

[Clause 2] The cooling system of clause 1, wherein the section of the cooling circuit thermally connected to the reservoir containing the PCM is positioned downstream of a cold outlet of the external cooling unit and upstream of cold inlets of the plurality of internal cooling units within the cooling circuit.

[Clause 3] The cooling system of clause 2, further comprising a fluid storage tank connected within the cooling circuit, upstream of the cold inlets of the plurality of internal cooling units.

[Clause 4] The cooling system of any one of clauses 1 to 3, further comprising:
- a first direct valve positioned upstream or downstream of the external cooling unit in the cooling circuit, the first direct valve being opened to place the external cooling unit within the cooling circuit, the first direct valve being closed to isolate the external cooling unit from the cooling circuit;
- a first bypass valve positioned in parallel to the external cooling unit in the cooling circuit; and
- a controller configured to:
  - cause the first direct valve to open and cause the first bypass valve to close to allow the external cooling unit to cool down the heat-transfer fluid, and
  - cause the first direct valve to close and cause the first bypass valve to open to ensure a continuity of the cooling circuit.

[Clause 5] The cooling system of clause 4, wherein the controller is further configured to:
- cause the first direct valve to open and cause the first bypass valve to close when an ambient temperature at the infrastructure is less than a first predetermined temperature threshold, and
- cause the first direct valve to close and cause the first bypass valve to open when the ambient temperature at the infrastructure meets or exceeds the first predetermined temperature threshold.

[Clause 6] The cooling system of any one of clauses 1 to 5, further comprising:
- a second direct valve positioned upstream or downstream of the reservoir containing the PCM in the cooling circuit, the second direct valve being opened to place the reservoir containing the PCM within the cooling circuit, the second direct valve being closed to isolate the reservoir containing the PCM from the cooling circuit;
- a second bypass valve positioned in parallel to the reservoir containing the PCM in the cooling circuit; and
- a controller configured to:
  - cause the second direct valve to open and cause the second bypass valve to close to allow a transfer of heat between the PCM and the heat-transfer fluid, and
  - cause the second direct valve to close and cause the second bypass valve to open to prevent a transfer of heat between the PCM and the heat-transfer fluid and to ensure a continuity of the cooling circuit.

[Clause 7] The cooling system of clause 6, wherein the controller is further configured to:
- cause the second direct valve to open and cause the second bypass valve to close when an ambient temperature at the infrastructure meets or exceeds a second predetermined temperature threshold, and
- cause the second direct valve to close and cause the second bypass valve to open when the ambient temperature at the infrastructure is less than the second predetermined temperature threshold.

[Clause 8] The cooling system of any one of clauses 1 to 7, further comprising a supplemental cooling device thermally connected to the reservoir containing the PCM and configured to dissipate heat from the reservoir containing the PCM to the atmosphere.

[Clause 9] The cooling system of clause 8, wherein the supplemental cooling device comprises an element selected from:
- an array of heat pipes extending from the reservoir containing the PCM;
- an array of loop heat pipes extending from the reservoir containing the PCM;
- an array of capillary pumped loops extending from the reservoir containing the PCM;
- an array of thermosiphons extending from the reservoir containing the PCM; and
- a dry cooler.

[Clause 10] The cooling system of clause 8 or 9 further comprising:
- an evaporative cooling system including a sprayer and a fan configured for directing water droplets toward the supplemental cooling device; and
- a controller configured to initiate operation of the evaporative cooling system when an ambient temperature at the infrastructure meets or exceeds a third predetermined temperature threshold.

[Clause 11] The cooling system of clause 8, further comprising:
- a controller configured to initiate operation of the supplemental cooling device when an ambient temperature at the infrastructure meets or exceeds a fourth predetermined temperature threshold;
- wherein the supplemental cooling device comprises an element selected from one or more fans, a geothermal cooling system, a fatal energy recovery system, and a combination thereof.

[Clause 12] A cooling arrangement for autonomous cooling of a rack hosting at least one heat-generating component, characterized in that the cooling arrangement comprises:
- a closed loop cooling circuit comprising:
  - at least one fluid cooling unit thermally coupled to the at least one heat-generating component, the at least one fluid cooling unit comprising a fluid channel configured for transferring heat from the at least one heat-generating component to a first fluid flowing in the fluid channel,
  - a primary side of a fluid-to-fluid heat exchanger, the primary side being fluidly connected to the fluid channel of the at least one fluid cooling unit, and
  - a pump fluidly connected between the primary side of the fluid-to-fluid heat exchanger and the at least one fluid cooling unit, the pump being configured for causing the first fluid to flow within the closed loop cooling circuit;
- an open loop cooling circuit comprising:
  - a secondary side of the fluid-to-fluid heat exchanger, the secondary side being thermally coupled to the primary side for transfer of heat from the primary side to the secondary side when a temperature of the primary side is higher than a temperature of the secondary side, the secondary side being configured to receive a second fluid from a cold supply line and to return the second fluid to a hot return line; and
- a reservoir containing a phase change material (PCM), the reservoir being thermally connected to a section of the closed loop cooling circuit, the PCM changing from a liquid state to a solid state to transfer thermal energy from the PCM to the closed loop cooling circuit when a temperature of the first fluid flowing in the section of the closed loop cooling circuit is less than a phase change temperature value of the PCM, the PCM changing from the solid state to the liquid state to transfer thermal energy from the closed loop cooling circuit to the PCM when the temperature of the first fluid flowing in the section of the closed loop cooling circuit reaches or exceeds the phase change temperature.

[Clause 13] The cooling arrangement of clause 12, wherein the reservoir containing the PCM is thermally connected to a cold outlet of the primary side of the fluid-to-fluid heat exchanger and to a cold inlet of the at least one fluid cooling unit.

[Clause 14] The cooling arrangement of clause 12 or 13, wherein:
- the cold supply line is fluidly connected to a cold outlet of an external cooling unit; and
- the hot return line is fluidly connected to a hot inlet of the external cooling unit.

[Clause 15] The cooling arrangement of any one of clauses 12 to 14, further comprising:
- a valve fluidly connected to the cold supply line or to the hot return line;
- a closed loop temperature sensor configured to measure a temperature of the first fluid supplied to the at least one fluid cooling unit; and
- a controller configured to:
  - receive a measured temperature of the first fluid from the closed loop temperature sensor;
  - cause the valve to close when the measured temperature of the first fluid is less than a first high temperature threshold, and cause the valve to open when the measured temperature of the first fluid meets or exceeds the first high temperature threshold.

[Clause 16] The cooling arrangement of clause 15, wherein:
- the fluid channel of the at least one fluid cooling unit extends between a cold inlet and a hot outlet of the at least one fluid cooling unit; and
- the closed loop temperature sensor is configured to measure the temperature of the first fluid supplied to the cold inlet of the at least one fluid cooling unit.

[Clause 17] The cooling arrangement of clause 14, further comprising:
- a valve fluidly connected to the cold supply line or to the hot return line; and
- a controller configured to:
  - cause the valve to open under normal operating conditions of the external cooling unit, and
  - cause the valve to close under abnormal operating conditions of the external cooling unit.

[Clause 18] The cooling arrangement of clause 17, further comprising:
- an open loop temperature sensor configured to measure a temperature of the second fluid supplied by the cold supply line;
- wherein the controller is further configured to:
  - receive a measured temperature of the second fluid from the open loop temperature sensor,
  - cause the valve to open when the measured temperature of the second fluid is less than a second high temperature threshold; and
  - cause the valve to close when the measured temperature of the second fluid meets or exceeds the second high temperature threshold.

[Clause 19] A cooling device mountable on a heat-generating component, comprising:
- a first casing configured for direct mounting on the heat-generating component; and
- a second casing mounted on the first casing;
- one of the first and second casings including an internal channel connected to a cold inlet and to a hot outlet allowing a heat-transfer fluid to flow in the internal channel; and
- another one of the first and second casings including a storage containing a phase change material (PCM), the PCM changing from a solid state to a liquid state to transfer thermal energy from the heat-generating unit to the PCM, the PCM changing from the liquid state to the solid state to transfer thermal energy from the PCM to the heat-transfer fluid.

[Clause 20] The cooling device of clause 19, wherein the second casing is welded to the first casing.

[Clause 21] The cooling device of clause 19 or 20, wherein the first casing comprises an indentation configured for mating with an outer periphery of the second casing.

[Clause 22] The cooling device of any one of clauses 19 to 21, wherein the first and second casings have a perimeter shape selected from a rectangle, a square and a circle.

[Clause 23] The cooling device of any one of clauses 19 to 22, wherein the heat-transfer fluid flowing in the internal channel is water.

[Clause 24] The cooling device of any one of clauses 19 to 23, wherein:
the first casing comprises:
a first closed face configured for mounting on the heat-generating component,
a first closed peripheral structure extending from the first closed face, and
a first open face defined by edges of the first closed peripheral structure opposite from the first closed face;
the second casing comprises:
a second closed face configured for being welded to the first closed peripheral structure of the first casing to seal the first open face of the first casing,
a second closed peripheral structure extending from the second closed face, and
an insulator plate sealingly connected to edges of the second closed peripheral structure opposite from the second closed face.

[Clause 25] The cooling device of any one of clauses 19 to 24, wherein:
the internal channel is included in the first casing;
the storage containing the PCM is included in the second casing; and
the cold inlet and the hot outlet pass through the second casing to reach the internal channel in the first casing.

[Clause 26] The cooling device of clause 24, wherein:
the internal channel is located between the first closed face and the second closed face;
the storage containing the PCM is located between the second closed face and the insulator plate; and
the cold inlet and the hot outlet pass through the second closed peripheral structure to reach the internal channel in the first casing.

[Clause 27] The cooling device of any one of clauses 19 to 24, wherein:
the storage containing the PCM is included in the first casing; and
the internal channel is included in the second casing.

[Clause 28] The cooling device of clause 24, wherein:
the storage containing the PCM is located between the first closed face and the second closed face;
the internal channel is located between the second closed face and the insulator plate; and
the cold inlet and the hot outlet pass through the insulator plate.

[Clause 29] The cooling device of clause 28, further comprising a plurality of fins extending from the first closed face within the storage containing the PCM.

[Clause 30] A method for cooling a heat-generating component, comprising:
mounting the cooling device of any one of clauses 27 to 29 on the heat-generating component;
operating the cooling device autonomously without a flow of heat-transfer fluid in the internal channel;
detecting an increase of a temperature of the heat-generating component; and
initiating the flow of heat-transfer fluid in the internal channel in response to detecting the increase of the temperature of the heat-generating component.
normally maintaining a flow of heat-transfer fluid in the internal channel;
wherein the PCM is configured to temporarily absorb heat from dissipated by the heat-generating component if the flow of heat-transfer fluid is stopped.

[Clause 31] A method for cooling a heat-generating component, comprising:
mounting the cooling device of any one of clauses 19 to 29 on the heat-generating component;
initiating a flow of heat-transfer fluid in the internal channel;
normally maintaining a flow of heat-transfer fluid in the internal channel;
wherein the PCM is configured to temporarily absorb heat from dissipated by the heat-generating component if the flow of heat-transfer fluid is stopped.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A cooling system for cooling electronic equipment, the cooling system providing cooling to an infrastructure having a plurality of heat-generating units, the cooling system comprising:
a plurality of internal cooling units, at least one internal cooling unit of the plurality of internal cooling units being thermally connected to each of the plurality of heat-generating units;
an external cooling unit configured to dissipate thermal energy of a heat-transfer fluid circulating in the plurality of internal cooling units;
a cooling circuit connecting the plurality of internal cooling units and the external cooling unit;
a pump configured to maintain a flow of the heat-transfer fluid circulating in the cooling circuit, allowing to transfer thermal energy from the plurality of heat generating units to the heat-transfer fluid and allowing to transfer thermal energy from the heat-transfer fluid to the external cooling unit;
a first reservoir thermally connected to a section of the cooling circuit, the first reservoir containing a first phase change material (PCM), the first PCM changing from a solid state to a liquid state when a temperature of the heat-transfer fluid flowing in the section of the cooling circuit causes a temperature of the first PCM to increase above a phase-change temperature value, thereby causing thermal energy to transfer from the cooling circuit to the first PCM, the first PCM changing from the liquid state to the solid state when the temperature of the heat-transfer fluid flowing in the section of the cooling circuit causes the temperature of the first PCM to decrease below the phase-change temperature value, thereby causing thermal energy to dissipate from the first PCM;
a supplemental cooling device thermally connected to the first reservoir containing the first PCM and configured to dissipate heat from the first reservoir containing the first PCM to the atmosphere;
a controller configured to initiate operation of the supplemental cooling device when an ambient temperature at the infrastructure meets or exceeds a predetermined temperature threshold; and
an evaporative cooling system including a sprayer and a fan configured for directing water droplets toward the supplemental cooling device;
wherein the controller is configured to initiate operation of the evaporative cooling system when the ambient temperature at the infrastructure meets or exceeds the predetermined temperature threshold.

2. The cooling system of claim 1, wherein the supplemental cooling device comprises an element selected from:
one or more fans;
a geothermal cooling system;
a fatal energy recovery system;
an array of heat pipes extending from the first reservoir containing the first PCM;
an array of loop heat pipes extending from the first reservoir containing the first PCM;
an array of capillary pumped loops extending from the first reservoir containing the first PCM;
an array of thermosiphons extending from the first reservoir containing the first PCM;
a dry cooler; and
a combination thereof.

3. The cooling system of claim 1, wherein the section of the cooling circuit thermally connected to the first reservoir containing the first PCM is positioned downstream of a cold outlet of the external cooling unit and upstream of cold inlets of the plurality of internal cooling units within the cooling circuit.

4. The cooling system of claim 3, further comprising a fluid storage tank connected within the cooling circuit, upstream of the cold inlets of the plurality of internal cooling units.

5. A cooling system for cooling electronic equipment, the cooling system providing cooling to an infrastructure having a plurality of heat-generating units, the cooling system comprising:
a plurality of internal cooling units, at least one internal cooling unit of the plurality of internal cooling units being thermally connected to each of the plurality of heat-generating units;
an external cooling unit configured to dissipate thermal energy of a heat-transfer fluid circulating in the plurality of internal cooling units;
a cooling circuit connecting the plurality of internal cooling units and the external cooling unit;
a pump configured to maintain a flow of the heat-transfer fluid circulating in the cooling circuit, allowing to transfer thermal energy from the plurality of heat generating units to the heat-transfer fluid and allowing to transfer thermal energy from the heat-transfer fluid to the external cooling unit;
a first reservoir thermally connected to a section of the cooling circuit, the first reservoir containing a first phase change material (PCM), the first PCM changing from a solid state to a liquid state when a temperature of the heat-transfer fluid flowing in the section of the cooling circuit causes a temperature of the first PCM to increase above a phase-change temperature value, thereby causing thermal energy to transfer from the cooling circuit to the first PCM, the first PCM changing from the liquid state to the solid state when the temperature of the heat-transfer fluid flowing in the section of the cooling circuit causes the temperature of the first PCM to decrease below the phase-change temperature value, thereby causing thermal energy to dissipate from the first PCM;
a supplemental cooling device thermally connected to the first reservoir containing the first PCM and configured to dissipate heat from the first reservoir containing the first PCM to the atmosphere; and
a cooling arrangement configured for autonomous cooling of a rack hosting at least one heat-generating component in case of abnormal operating conditions of the cooling system, the cooling arrangement comprising:
a closed loop cooling circuit comprising:
at least one fluid cooling unit thermally coupled to the at least one heat-generating component, the at least one fluid cooling unit comprising a fluid channel configured for transferring heat from the at least one heat-generating component to a first fluid flowing in the fluid channel,
a primary side of a fluid-to-fluid heat exchanger, the primary side being fluidly connected to the fluid channel of the at least one fluid cooling unit, and
an inner pump fluidly connected between the primary side of the fluid-to-fluid heat exchanger and the at least one fluid cooling unit, the inner pump being configured for causing the first fluid to flow within the closed loop cooling circuit;
an open loop cooling circuit comprising:
a secondary side of the fluid-to-fluid heat exchanger, the secondary side being thermally coupled to the primary side for transfer of heat from the primary side to the secondary side when a temperature of the primary side is higher than a temperature of the secondary side, the secondary side being configured to receive a second fluid from a cold supply line and to return the second fluid to a hot return line, and
one or two valves connected to the cold supply line or to the hot supply line and configured to close under abnormal operating conditions; and
a second reservoir containing a second PCM, the second reservoir being thermally connected to a section of the closed loop cooling circuit, the second PCM changing from the liquid state to the solid state to transfer thermal energy from the second PCM to the closed loop cooling circuit when a temperature of the first fluid flowing in the section of the closed loop cooling circuit is less than a phase change temperature value of the second PCM, the second PCM changing from the solid state to the liquid state to transfer thermal energy from the closed loop cooling circuit to the second PCM when the temperature of the first fluid flowing in the section of the closed loop cooling circuit reaches or exceeds the phase change temperature;
wherein, in normal operating conditions of the cooling system, the cooling arrangement and the at least one heat-generating component are combined to form the internal cooling unit and the heat-generating unit, heat generated inside the infrastructure by the at least one heat-generating component being evacuated by the cooling arrangement via the hot return line to the cooling circuit, in order to be externally dissipated to the atmosphere by the cooling system, the fluid flowing in the cooling circuit having been cooled by the cooling system being then supplied to the cooling arrangement via the cold supply line.

6. The cooling system of claim 5, wherein the at least one fluid cooling unit further comprises:
a first casing configured for direct mounting on the at least one heat-generating component; and
a second casing mounted on the first casing, one of the first and second casings including the fluid channel; and
another one of the first and second casings including a storage containing a third PCM changing from the solid state to the liquid state to transfer thermal energy from the at least one heat-generating unit to the third PCM, the third PCM changing from the liquid state to the solid state to transfer thermal energy from the third PCM to the first fluid flowing in the fluid channel.

7. A cooling system for cooling electronic equipment, the cooling system providing cooling to an infrastructure having a plurality of heat-generating units, the cooling system comprising:
- a plurality of internal cooling units, at least one internal cooling unit of the plurality of internal cooling units being thermally connected to each of the plurality of heat-generating units;
- an external cooling unit configured to dissipate thermal energy of a heat-transfer fluid circulating in the plurality of internal cooling units;
- a cooling circuit connecting the plurality of internal cooling units and the external cooling unit;
- a pump configured to maintain a flow of the heat-transfer fluid circulating in the cooling circuit, allowing to transfer thermal energy from the plurality of heat generating units to the heat-transfer fluid and allowing to transfer thermal energy from the heat-transfer fluid to the external cooling unit;
- a first reservoir thermally connected to a section of the cooling circuit, the first reservoir containing a first phase change material (PCM), the first PCM changing from a solid state to a liquid state when a temperature of the heat-transfer fluid flowing in the section of the cooling circuit causes a temperature of the first PCM to increase above a phase-change temperature value, thereby causing thermal energy to transfer from the cooling circuit to the first PCM, the first PCM changing from the liquid state to the solid state when the temperature of the heat-transfer fluid flowing in the section of the cooling circuit causes the temperature of the first PCM to decrease below the phase-change temperature value, thereby causing thermal energy to dissipate from the first PCM;
- a supplemental cooling device thermally connected to the first reservoir containing the first PCM and configured to dissipate heat from the first reservoir containing the first PCM to the atmosphere;
- a first direct valve positioned upstream or downstream of the first reservoir containing the first PCM in the cooling circuit, the first direct valve being opened to place the first reservoir containing the first PCM within the cooling circuit, the first direct valve being closed to isolate the first reservoir containing the first PCM from the cooling circuit;
- a first bypass valve positioned in parallel to the first reservoir containing the first PCM in the cooling circuit; and
- a controller configured to:
  - cause the first direct valve to open and cause the first bypass valve to close to allow a transfer of heat between the first PCM and the heat-transfer fluid when an ambient temperature at the infrastructure meets or exceeds a predetermined temperature threshold, and
  - cause the first direct valve to close and cause the first bypass valve to open to prevent a transfer of heat between the first PCM and the heat-transfer fluid and to ensure a continuity of the cooling circuit when the ambient temperature at the infrastructure is less than the predetermined temperature threshold.

8. The cooling system of claim 7 further comprising:
- a second direct valve positioned upstream or downstream of the external cooling unit in the cooling circuit, the second direct valve being opened to place the external cooling unit within the cooling circuit, the second direct valve being closed to isolate the external cooling unit from the cooling circuit; and
- a second bypass valve positioned in parallel to the external cooling unit in the cooling circuit;
- the controller being further configured to:
  - cause the second direct valve to open and cause the second bypass valve to close to allow the external cooling unit to cool down the heat-transfer fluid, and
  - cause the second direct valve to close and cause the second bypass valve to open to ensure a continuity of the cooling circuit.

9. The cooling system of claim 8, wherein the controller is further configured to:
- cause the second direct valve to open and cause the second bypass valve to close when an ambient temperature at the infrastructure is less than a predetermined temperature threshold, and
- cause the second direct valve to close and cause the second bypass valve to open when the ambient temperature at the infrastructure meets or exceeds the predetermined temperature threshold.

* * * * *